(12) United States Patent
Xu et al.

(10) Patent No.: US 12,035,555 B2
(45) Date of Patent: Jul. 9, 2024

(54) ORGANIC LIGHT-EMITTING DIODE DEVICE AND DISPLAY APPARATUS

(71) Applicant: YUNGU (GU'AN) TECHNOLOGY CO., LTD., Hebei (CN)

(72) Inventors: Jin Xu, Kunshan (CN); Xiaokang Zhou, Kunshan (CN); Hu Wang, Kunshan (CN); Wei Zhao, Kunshan (CN); Zhaoyang Xi, Kunshan (CN); Mengzhen Li, Kunshan (CN)

(73) Assignee: YUNGU (GU'AN) TECHNOLOGY CO., LTD., Hebei (CN)

( * ) Notice: Subject to any disclaimer, the term of this patent is extended or adjusted under 35 U.S.C. 154(b) by 479 days.

(21) Appl. No.: 17/398,652

(22) Filed: Aug. 10, 2021

(65) Prior Publication Data
US 2021/0399251 A1    Dec. 23, 2021

Related U.S. Application Data

(63) Continuation of application No. PCT/CN2020/094024, filed on Jun. 2, 2020.

(30) Foreign Application Priority Data
Jul. 29, 2019 (CN) .......................... 201910690456.8

(51) Int. Cl.
H01L 21/00    (2006.01)
H10K 50/11    (2023.01)
(Continued)

(52) U.S. Cl.
CPC ............ *H10K 50/165* (2023.02); *H10K 50/11* (2023.02); *H10K 50/166* (2023.02); *H10K 50/18* (2023.02);
(Continued)

(58) Field of Classification Search
CPC .... H10K 50/165; H10K 50/166; H10K 50/18; H10K 50/11; H10K 2101/40; H10K 2101/30; H10K 85/30; H10K 85/6572
See application file for complete search history.

(56) References Cited

U.S. PATENT DOCUMENTS 6,838,193 B2 * 1/2005 Tao ...................... H10K 85/633
                                                          428/917
7,517,595 B2 * 4/2009 Begley ................... C09K 11/06
                                                          428/917
(Continued)

FOREIGN PATENT DOCUMENTS

CN    2834097 Y    11/2006
CN    102394278 A    3/2012
(Continued)

OTHER PUBLICATIONS

International Search Report and Written Opinion (International Application No. PCT/CN2020/094024) with English Translation, dated Aug. 27, 2020, 12 pages.
(Continued)

*Primary Examiner* — Richard A Booth
(74) *Attorney, Agent, or Firm* — Quarles & Brady LLP (57) ABSTRACT

Disclosed is an organic light-emitting diode device including: an electron transport layer, a hole blocking layer and a
(Continued)

light emitting layer arranged in a stacked manner; the hole blocking layer includes a first material, and the electron transport layer includes the first material.

20 Claims, 5 Drawing Sheets

(51) Int. Cl.
*H10K 50/16* (2023.01)
*H10K 50/165* (2023.01)
*H10K 50/18* (2023.01)
H10K 85/30 (2023.01)
H10K 85/60 (2023.01)
H10K 101/30 (2023.01)
H10K 101/40 (2023.01)

(52) U.S. Cl.
CPC ......... *H10K 85/30* (2023.02); *H10K 85/6572* (2023.02); *H10K 2101/30* (2023.02); *H10K 2101/40* (2023.02)

(56) References Cited

U.S. PATENT DOCUMENTS

2002/0067124 A1 6/2002 Kafafi et al.
2017/0373254 A1 12/2017 Lee et al.

FOREIGN PATENT DOCUMENTS

| CN | 103633250 A | 3/2014 |
| CN | 105647520 A | 6/2016 |
| CN | 103762317 B | 8/2016 |
| CN | 103887444 B | 2/2017 |
| CN | 107721904 A | 2/2018 |
| CN | 110459688 A | 11/2019 |

OTHER PUBLICATIONS

First Office Action and supplementary report (CN Application No. 201910690456.8) with English Translation, dated Mar. 24, 2022, 6 pages.

* cited by examiner

ORGANIC LIGHT-EMITTING DIODE DEVICE AND DISPLAY APPARATUS

CROSS-REFERENCE TO RELATED APPLICATIONS

The present application is a continuation application of the PCT application No. PCT/CN2020/094024, filed on Jun. 2, 2020, which claims priority to Chinese Patent Application No. 201910690456.8, filed on Jul. 29, 2019, and the contents of both applications are herein incorporated by reference in their entirety.

TECHNICAL FIELD

The present disclosure relates to the field of the display technology.

BACKGROUND

The Active-Matrix Organic Light-Emitting Diode (AMO-LED) display screens are widely used in many fields due to advantages of self-luminescence, wide viewing angle, high contrast, and short response time thereof.

SUMMARY

In view of this, in order to address the technical problem that the service life of the existing active-matrix organic light-emitting diode display screen is short, it is necessary to provide an organic light-emitting diode device and a display apparatus.

An organic light-emitting diode device includes:
an electron transport layer, a hole blocking layer and a light emitting layer arranged in a stacked manner;
the hole blocking layer includes a first material configured to block a hole in the light emitting layer, and the electron transport layer includes the first material.

A display apparatus includes the above-mentioned organic light-emitting diode device.

In the organic light-emitting diode device and the display apparatus provided by the embodiments of the present disclosure, the hole blocking layer includes a first material configured to block a hole in the light emitting layer. Since the hole blocking layer is configured to block the transport of the hole, the first material has a lower electron mobility; then the electron transport layer is made of the first material, which can reduce the electron mobility of the electron transport layer. Therefore, the rate of the migration of the electron through the electron transport layer to the light emitting layer is decreased, and the distance the electron moves becomes shorter. In the light emitting layer, the recombination area of the electron and hole can be shifted along a direction from the interface between the light emitting layer and the electron blocking layer to the electron transport layer, that is, the recombination area can move from the interface between the light emitting layer and the electron blocking layer to the middle area of the light emitting layer, while widening the recombination area. Therefore, the recombination reaction occurring in the recombination area does not affect the structures of the light emitting layer and the electron blocking layer, thereby prolonging the service life of the organic light-emitting diode device.

DETAILED DESCRIPTION

The previous AMOLED display screens have a short service life, which affects the further popularization of the AMOLED display screen technology.

In order to make the objectives, technical solutions, and advantages of the present disclosure clearer and easier to understand, the organic light-emitting diode device and the display apparatus of the present disclosure will be further described in detail below through embodiments in conjunction with the accompanying drawings. It should be appreciated that the specific embodiments described here are merely utilized to explain the present disclosure, rather than limiting the present disclosure.

The serial numbers assigned to the components herein, such as "first", "second", etc., are merely utilized to distinguish the described objects and do not have any sequence or technical meaning. The terms "connection" and "link" mentioned in the disclosure both include direct and indirect connection (link) unless otherwise specified. In the description of the present disclosure, it should be appreciated that the orientations or position relationships indicated by the terms "upper", "lower", "front", "rear", "left", "right", "vertical", "horizontal", "top", "bottom", "inner", "outer", "clockwise", "counterclockwise", etc., are based on the orientations or position relationships shown in the drawings, and are only for the convenience of describing the disclosure and simplifying the description, rather than indicating or implying that the pointed device or element definitely has a specific orientation, or is constructed and operated in a specific orientation. Therefore, these terms cannot be understood as a limitation to the present disclosure.

Figure 1:
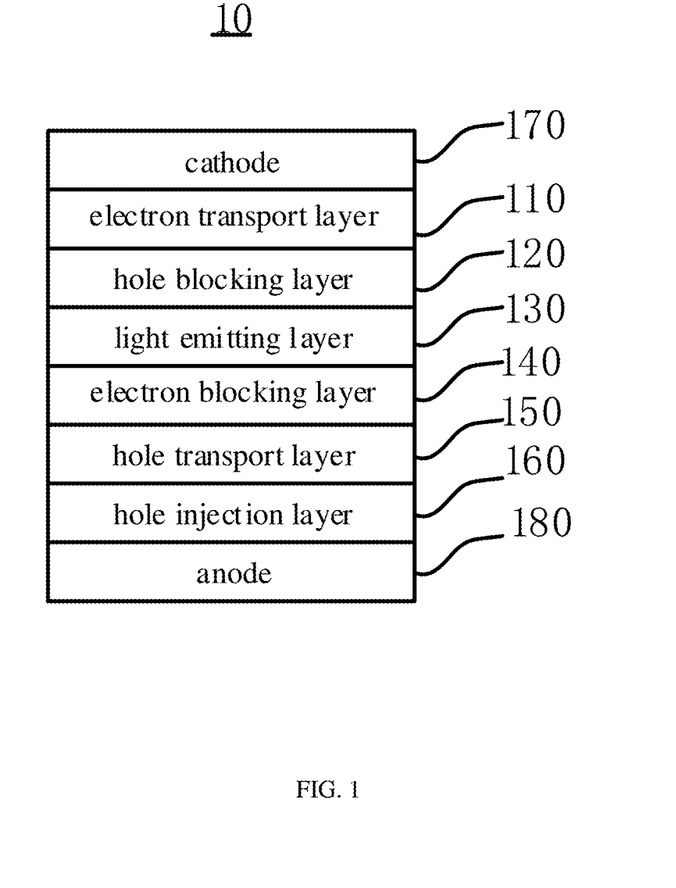
FIG. 1 is a schematic structure diagram of an organic light-emitting diode device according to an embodiment of the present disclosure.

In the present disclosure, unless expressly stipulated and defined otherwise, that the first feature "on" or "under" the second feature may be that the first feature is directly in contact with the second feature, or the first feature is in connection with the second feature through an intermediate element. Moreover, that the first feature is "above", "over" and "on" the second feature may mean that the first feature is directly over or obliquely above the second feature, or it simply means that the level of the first feature is higher than that of the second feature. That the first feature is "below", "under" and "down" the second feature may mean that the first feature is directly under or obliquely below the second feature, or it simply means that the level of the first feature is smaller than that of the second feature. Referring to FIG. 1, in an embodiment of the present disclosure an organic light-emitting diode device 10 is provided. The organic light-emitting diode device 10 includes an electron transport layer 110, a hole blocking layer 120, and a light emitting layer 130 which are stacked. The organic light-emitting diode device 10 may further include an electron blocking layer 140, a hole transport layer 150, and a hole injection layer 160 which are sequentially provided on a side of the light emitting layer 130 away from the electron transport layer 110. The electron blocking layer 140 is adjacent to the light emitting layer 130; the hole transport layer 150 is located between the electron blocking layer 140 and the hole injection layer 160. A cathode 170 and an anode 180 are respectively provided on both sides of the organic light-emitting diode device 10. The cathode 170 is adjacent to the electron transport layer 110, and the anode 180 is adjacent to the hole injection layer 160. The electron transport layer 110 can be configured to transport electrons. The first hole blocking layer 120 is configured to block a movement of the hole toward the electron transport layer 110. The light emitting layer 130 can have a recombination area configured to recombine photons and electrons to emit light. The electron blocking layer 140 is configured to block movements of electrons toward the hole transport layer 150. The hole transport layer 150 is configured to transport holes to the light emitting layer 130. The hole injection layer 160 is configured to inject holes.

Since the light emitting material in the light emitting layer 130 is an electronic type of material (e.g., an electronic blue light emitting material), and the electron type of material is electrophilic and hole repellent. Therefore, in the light emitting layer 130, the electrons migrate from the electron transport layer 110 to an interface between the electron blocking layer 140 and the light emitting layers 130. Accordingly, an electron-hole recombination area is formed at the interface between the electron blocking layer 140 and the light emitting layer 130, which affects the structures of the light emitting layer 130 and the electron blocking layer 140, thereby affecting the service life of the electronic device.

In this embodiment, the hole blocking layer 120 includes a first material; and the first material can effectively prevent the hole from penetrating the hole blocking layer. The first material can be a polyaryl-substituted pyridine derivative. In an embodiment, the first material can be phenanthroline (Bphen), bathocuproine (BCP), 1,3,5-tris(1-phenyl-1H-benzimidazol-2-yl) benzene (TPBi) and so on. The electron transport layer 110 also includes the aforementioned first material.

The material of the traditional electron transport layer facilitates the transport of electrons to the light emitting layer 130. The first material is configured to restrict the hole in the light emitting layer 130. The material of the hole blocking layer can help block the hole from transferring toward the electron transport layer 110 and the cathode 170. Therefore, a host material for the traditional electron transport layer has a higher electron mobility. In order to block the transport of the hole, the host material of the traditional hole blocking layer is a material with a lower electron mobility. Therefore, the electron mobility of the host material of the conventional hole blocking layer is lower than the electron mobility of the host material of the conventional electron transport layer.

In the embodiment of the present disclosure, the hole blocking layer 120 includes a first material. Since the hole blocking layer 120 is configured to block the transport of the hole, the hole blocking layer 120 including the first material has a lower electron mobility. By using the first material to manufacture the electron transport layer 110, the electron mobility of the electron transport layer 110 can be reduced. Therefore, a rate of migration of the electron through the electron transport layer 110 to the light emitting layer 130 is decreased, and a distance the electron moves becomes shorter. In the light emitting layer 130, the recombination area of the electron and the hole shifts along a direction from the interface between the light emitting layer 130 and the electron blocking layer 140 to the electron transport layer 110, that is, the recombination area may move from the interface between the light emitting layer 130 and the electron blocking layer 140 to a middle area of the light emitting layer 130, while widening the recombination area. Therefore, the recombination reaction occurring in the recombination area does not affect the structures of the light emitting layer 130 and the electron blocking layer 140, thereby prolonging the service life of the organic light-emitting diode device 10.

For example, in an embodiment, the electron transport layer 110 includes a first film layer 111 and a second film layer 112 which are stacked. The second film layer 112 is adjacent to the hole blocking layer 120, and the second film layer 112 includes the first material.

In this embodiment, since the materials of the electron transport layer 110 and the hole blocking layer 120 both include the first material, the second film layer in the electron transport layer 110 and the hole blocking layer 120 can be manufactured by the same film forming process (e.g., evaporation) in one chamber, one mask can be removed and one chamber can be saved.

In an embodiment, the electron transport layer 110 is doped with 8-hydroxyquinoline-lithium (Liq). That is, the 8-hydroxyquinoline-lithium (Liq) can be doped in the first material to form the electron transport layer 110. The 8-hydroxyquinoline-lithium (Liq) can improve an injection capability of the electron. When the electron transport layer 110 is manufactured, the first material and the 8-hydroxyquinoline-lithium (Liq) can be simultaneously evaporated in one chamber, thereby forming the electron transport layer 110.

In an embodiment, in the electron transport layer 110, a doping ratio of the 8-hydroxyquinoline-lithium (Liq) is in a range of 20% to 80%. It can be understood that when the doping ratio of the 8-hydroxyquinoline-lithium (Liq) is less than 20%, because the content of the 8-hydroxyquinoline-lithium (Liq) is too low, the electron injection capability is affected, thereby affecting the luminous efficiency of the light emitting layer 130. If the doping ratio of the 8-hydroxyquinoline-lithium (Liq) is greater than 80%, the voltage of the organic light-emitting diode device 10 is increased, thereby affecting the service life of the organic light-emitting diode device 10. Therefore, the doping ratio of the 8-hydroxyquinoline-lithium (Liq) is in the range of 20% to 80%; apparently, the doping ratio of the 8-hydroxyquinoline-lithium (Liq) can be 20% or 80%.

TABLE 1

| Structure | Color coordinate x | Color coordinate y | Spectrum (nm) | Half-wave width (nm) | Voltage (V) | Current density (mA/cm$^2$) | Brightness (nits) | Efficiency (cd/A) | Efficiency (cd/A/y) |
|---|---|---|---|---|---|---|---|---|---|
| Before improvement | 0.136 | 0.052 | 462 | 18 | 4.71 | 12.16 | 733 | 6.0 | 115.0 |
| After improvement | 0.136 | 0.052 | 462 | 18 | 4.92 | 12.75 | | 5.7 | 109.7 |

Referring to Table 1, in the structure of the organic light-emitting diode device before the improvement, the host material of the hole blocking layer is different from the host material of the electron transport layer, so that the electron mobility of the host material of the hole blocking layer is lower than that of the host material of the electron transport layer. In the structure of the improved organic light-emitting diode device in an embodiment of the present disclosure, the hole blocking layer and the electron transport layer include the same first material, and make the hole blocking layer and the electron transport layer have the same lower electron mobility. It can be seen from Table 1, in the embodiments of the present disclosure, the main parameters, which affect the display performance of the display screen. include a color coordinate, a spectrum and a half-wave width, etc. These parameters do not change along with a structure alternation of the organic light-emitting diode device 10. Thus, the organic light-emitting diode device 10 provided in the embodiments of the present disclosure still has good light-emitting performance.

Figure 2:
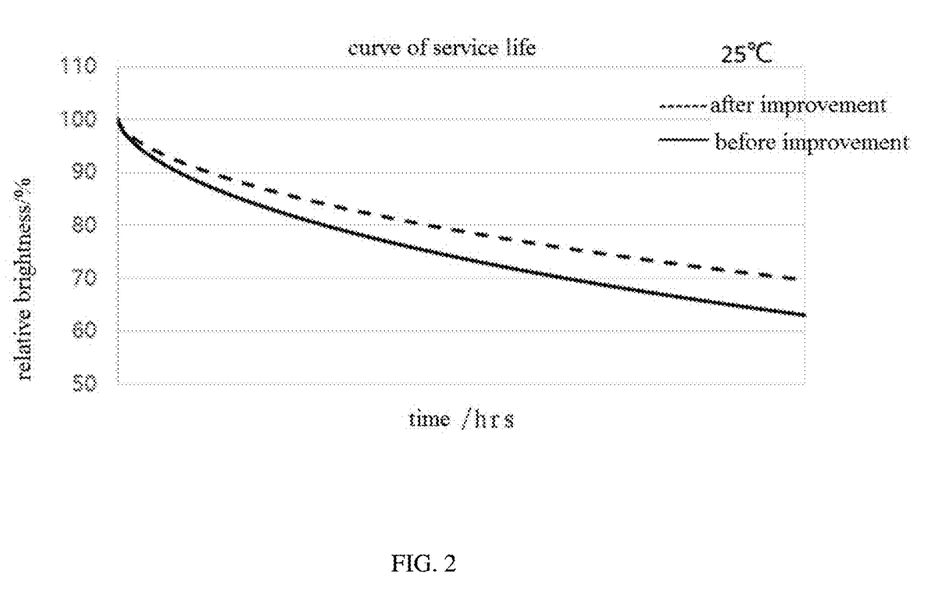
FIG. 2 is a schematic diagram illustrating a relationship between a relative brightness of an organic light-emitting diode device and time in an experimental environment at 25° C. according to an embodiment of the present disclosure.
Figure 3:
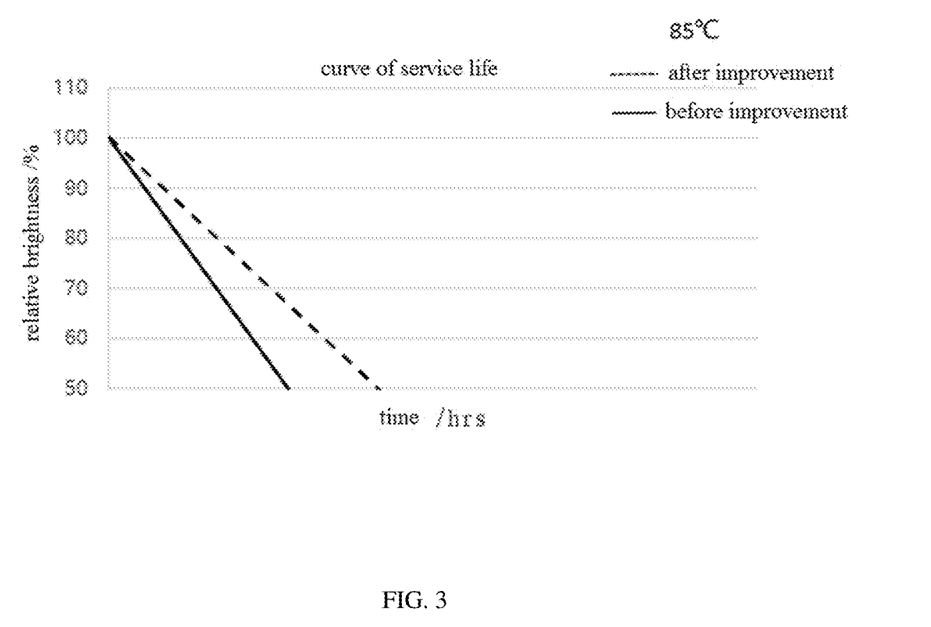
FIG. 3 is a schematic diagram illustrating a relationship between a relative brightness of an organic light-emitting diode device and time in an experimental environment at 85° C. according to an embodiment of the present disclosure.

Referring to FIGS. 2 and 3, under the experimental environments of 25° C. and 85° C., with the extension of time, the improved organic light-emitting diode device 10 has a slower relative brightness decay than the light-emitting device before the improvement, accordingly the service life of the organic light-emitting diode device 10 can be significantly improved.

In an embodiment, the doping ratio of the 8-hydroxyquinoline-lithium (Liq) is 45%. At this time, the electron injection capability of the organic light-emitting diode device 10 and the voltage value of the organic light-emitting diode device 10 are both in an optimum condition. Therefore, the technical solution of this embodiment can improve the service life of the organic light-emitting diode device 10 without affecting the performance of the organic light-emitting diode device 10.

In an embodiment, the electron mobility of the first material is less than $1\times10^{-6}$ cm$^2$V$^{-1}$s$^{-1}$. At this time, the rate of movement of the electron from the electron transport layer 110 toward the hole blocking layer 120 can be significantly reduced. Therefore, the recombination area can be moved in the light emitting layer 130 along a direction from the interface between the light emitting layer 130 and the electron blocking layer 140 to the electron transport layer 110, thereby avoiding the impact on the structures of the light emitting layer 130 and the electron blocking layer 140 caused by the physical reaction in the recombination area.

Figure 4:
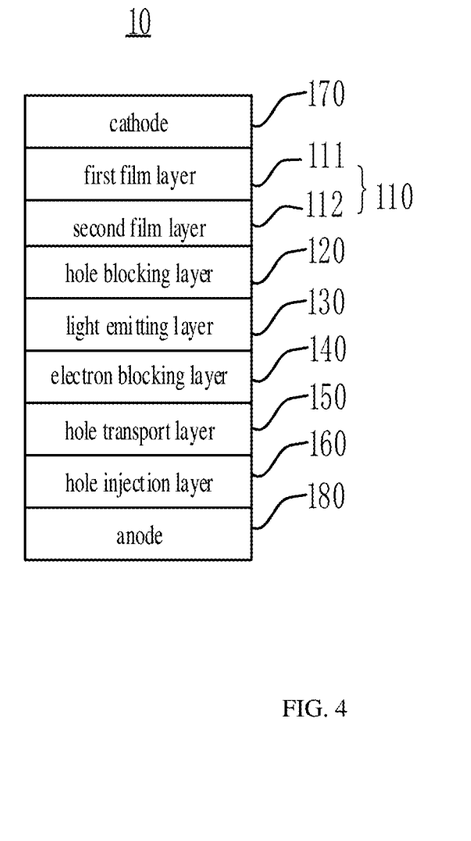
FIG. 4 is a schematic structure diagram of an organic light-emitting diode device according to another embodiment of the present disclosure.
Figure 5:
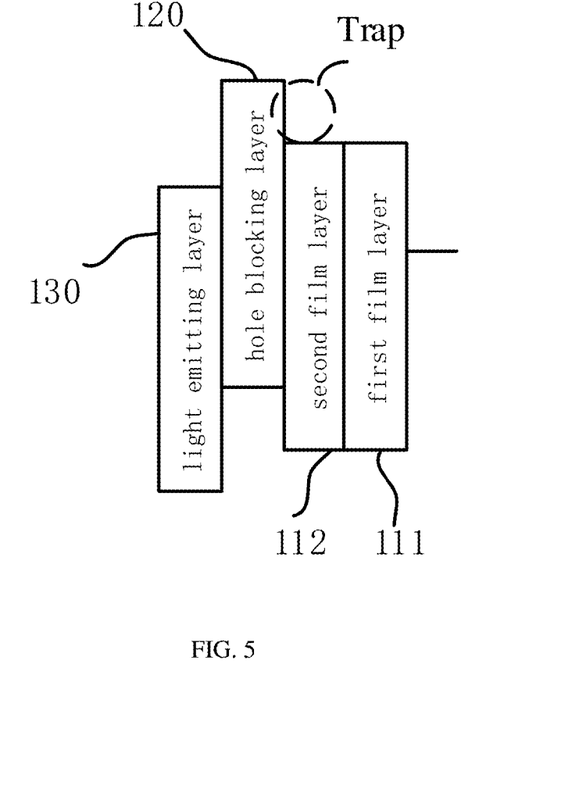
FIG. 5 is a schematic diagram of a trap of an organic light-emitting diode device according to an embodiment of the present disclosure.

Referring to FIGS. 4 and 5, in an embodiment, in the organic light-emitting diode device 10, the electron transport layer 110 includes a first film layer 111 and a second film layer 112 which are stacked; and the second film layer 112 is adjacent to the hole blocking layer 120; the second film layer 112 includes the first material, and the lowest unoccupied molecular orbital energy level of the first material in the second film layer 112 is less than the lowest unoccupied molecular orbital energy level of the first material in the first host material in the hole blocking layer 120. Therefore, a trap is formed between the hole blocking layer 120 and the second film layer 112; and the trap can further reduce the rate of movement of the electron from the electron transport layer 110 toward the light emitting layer 130, thereby promoting the recombination area to move in the light emitting layer 130 along a direction from the interface between the light emitting layer 130 and the electron blocking layer 140 to the middle area of the light emitting layer 130, and at the same time, the recombination area is widened, which further avoids the impact on the structures of the light emitting layer 130 and the electron blocking layer 140 caused by the physical reaction in the recombination area.

In an embodiment, the first film layer 111 does not include the first material.

In an embodiment, the hole blocking layer 120 can be a mixture composed of a lithium compound, a zinc powder, and a phosphorescent material.

In an embodiment, the lowest unoccupied molecular orbital (LUMO) energy level of the first material in the hole blocking layer is less than −2.6 ev. That is, the energy level of the first material in the hole blocking layer is shallower. The lowest unoccupied molecular orbit (LUMO) energy level of the first material in the second film layer is greater than −2.6 ev. In an embodiment, the lowest unoccupied molecular orbital energy level of the first material in the second film layer is greater than 1 ev. Within such range, the energy level of the first material in the second film layer is close to the energy level of the light emitting layer 130, which can reduce the electron mobility. A trap with a large drop can be formed between the first material of the first host material in the second film layer 112 and the first material of the hole blocking layer, so that the rate of the movement of the electron from the electron transport layer 110 to the light emitting layer 130 can be significantly reduced.

In an embodiment, the lowest unoccupied molecular orbital energy level of the first material in the second film layer is less than 2 ev, so that the luminous efficiency of the organic light-emitting diode device 10 is not affected by the too-small number of electrons moving to the light emitting layer 130.

In an embodiment, the electron mobility of the first material in the hole blocking layer is less than $1\times10^{-7}$ cm$^2$V$^{-1}$s$^{-1}$. It can be understood that the electron mobility of the first material in the second film layer can be less than the electron mobility of the first material in the hole blocking layer. Therefore, when the electron moves from the electron transport layer 110 to the first hole blocking layer 120, the rate of the movement rate of the electron can be further reduced. As a result, the recombination area moves in the light emitting layer 130 along a direction from the interface between the light emitting layer 130 and the electron blocking layer 140 to the electron transport layer 110, that is, moves to the middle area of the light emitting layer 130, thereby avoiding the impact on the structures of the light emitting layer 130 and the electron blocking layer 140 caused by the physical reaction in the recombination area.

In an embodiment, the thicknesses of the hole blocking layer 120 and the second film layer 112 range from 2 nm to 10 nm. The thickness of the hole blocking layer 120 is related to the rate of electron transport, the thickness of the organic light-emitting diode device 10, and the resistance of the organic light-emitting diode device 10. When the thicknesses of the hole blocking layer 120 and the second film layer 112 are both less than 2 nm, the movement distance of the electron through the second film layer 112 and the hole blocking layer 120 is too short, and then the effect of blocking the movement of the electron is worse, so that the effect of the movement of the recombination area in the light emitting layer 130 along a direction from the interface between the light emitting layer 130 and the electron blocking layer 140 to the electron transport layer 110 is worse. When the thicknesses of the second film layer 112 and the hole blocking layer 120 are both greater than 10 nm, since the second film layer 112 and the hole blocking layer 120 are both of the organic material, the resistance of the entire organic light-emitting diode device 10 may be increased, which affects the light-emitting performance of the organic light-emitting diode device 10.

In an embodiment, the thickness of the second film layer 112 can be 8 nm; and the thickness of the hole blocking layer 120 can be 5 cm. The capacity of the second film layer 112 to block the movement of the electron is worse than the capacity of the hole blocking layer 120 to block the movement of the electron. Therefore, the thickness of the second film layer 112 can be increased to improve the capacity of the second film layer to block the movement of the electron. The hole blocking layer 120 has a stronger capacity to block the movement of the electron, so that the thickness of the hole blocking layer 120 can be smaller. The cooperation of the second film layer 112 and the hole blocking layer 120 can significantly reduce the rate of the movement of the electron toward the light emitting layer 130. In such a way, the recombination area moves in the light emitting layer 130 along a direction from the interface between the light emitting layer 130 and the electron blocking layer 140 to the electron transport layer 110, thereby avoiding the impact on the structures of the light emitting layer 130 and the electron blocking layer 140 caused by the physical reaction in the recombination area.

In an embodiment, the thickness of the electron transport layer 110 ranges from 15 nm to 50 nm. The thickness of the electron transport layer 110 is related to the rate of the movement of the electron and the voltage of the organic light-emitting diode device 10. In the above range, the electron migration rate of the electron transport layer 110 can be reduced, and the voltage of the organic light-emitting diode device 10 can also be maintained in a normal range, thereby ensuring the performance of the organic light-emitting diode device 10. In an embodiment, the thickness of the electron transport layer 110 is in a range of 20 nm to 30 nm.

In an embodiment of the present disclosure, a display apparatus if further provided. The display apparatus can be a terminal, a tablet computer, an all-in-one computer, and the like. The terminal may be a mobile phone, a sports bracelet, a remote control, and the like. Since the display apparatus includes the organic light-emitting diode device 10, and the electron transport layer 110 of the organic light-emitting diode device 10 is made of the first material, in such a way, the electron mobility of the electron transport layer 110 can be reduced. Therefore, when the electron passes through the electron transport layer 110 to the light emitting layer 130, the rate of migration is decreased. The distance that the electron moves becomes shorter. In the light emitting layer 130, the recombination area of the electron and hole may shift from the interface between the light emitting layer 130 and the electron blocking layer 140 to the electron transport layer 110, that is, the recombination area is off the interface between the light emitting layer 130 and the electron blocking layer 140. Therefore, the recombination reaction occurring in the recombination area does not affect the structures of the light emitting layer 130 and the electron blocking layer 140, thereby prolonging the service life of the organic light-emitting diode device 10, and accordingly also prolonging the service life of the display apparatus.

It can be understood that the type of the display apparatus can be any one of an Organic Light-Emitting Diode (OLED) display apparatus, an In-Plane Switching (IPS) display apparatus, and a Twisted Nematic (TN) display apparatus, a Vertical Alignment (VA) display apparatus, an electronic paper, a Quantum Dot Light Emitting Diodes (QLED) display apparatus, or micro Light Emitting Diode (LED, μ LED) display apparatus and other display devices, which is not limited in the present disclosure.

The technical features in the above-mentioned embodiments can be combined arbitrarily. In order to make the description concise, all possible combinations of the various technical features in the above-mentioned embodiments are not described. However, as long as there is no contradiction in the combination of these technical features, all should be considered as the scope of the present disclosure.

The above-mentioned embodiments are merely some exemplary embodiments of the present disclosure, and the description is relatively specific and detailed, but they should not be interpreted as a limitation to the scope of the disclosure. It should be pointed out that those of ordinary skill in the art can make several modifications and improvements without departing from the concept of the disclosure, and these all fall within the protection scope of the present disclosure. Therefore, the scope of protection of the present disclosure shall be subject to the appended claims.

What is claimed is:

1. An organic light-emitting diode device, comprising:
an electron transport layer, a hole blocking layer and a light emitting layer arranged in a stacked manner;
wherein the hole blocking layer comprises a first material configured to block a hole in the light emitting layer, and the electron transport layer comprises the first material;
wherein the electron transport layer comprises a first film layer and a second film layer stacked on the first film layer, the second film layer is adjacent to the hole blocking layer, and the second film layer comprises the first material;
wherein the first film layer excludes the first material.

2. The organic light-emitting diode device according to claim 1, wherein the hole blocking layer and the second film layer are formed in a same film forming process.

3. The organic light-emitting diode device according to claim 2, wherein the film forming process is an evaporation process.

4. The organic light-emitting diode device according to claim 1, wherein the light emitting layer comprises an electronic blue light emitting material.

5. The organic light-emitting diode device according to claim 1, wherein the first material is one of phenanthroline (Bphen), bathocuproine (BCP), and 1,3,5-tris(1-phenyl-1H-benzimidazol-2-yl) benzene (TPBi).

6. The organic light-emitting diode device according to claim 1, wherein the electron transport layer is doped with 8-hydroxyquinoline-lithium (Liq).

7. The organic light-emitting diode device according to claim 6, wherein a doping ratio of the 8-hydroxyquinoline-lithium (Liq) in the electron transport layer is in a range of 20% to 80%.

8. The organic light-emitting diode device according to claim 1, wherein an electron mobility of the first material is less than $1\times10^{-6}$ cm$^2$V$^{-1}$s$^{-1}$.

9. The organic light-emitting diode device according to claim 1, wherein a lowest unoccupied molecular orbital energy level of the first material in the second film layer is less than a lowest unoccupied molecular orbital energy level of the first material in the hole blocking layer.

10. The organic light-emitting diode device according to claim 9, wherein the lowest unoccupied molecular orbital energy level of the first material in the hole blocking layer is less than −2.6 ev, and the lowest unoccupied molecular orbital energy level of the first material in the second film layer is greater than −2.6 ev.

11. The organic light-emitting diode device according to claim 9, wherein the lowest unoccupied molecular orbital energy level of the first material in the second film layer is less than 2 ev.

12. The organic light-emitting diode device according to claim 9, wherein the lowest unoccupied molecular orbital energy level of the first material in the second film layer is greater than 1 ev.

13. The organic light-emitting diode device according to claim 8, wherein thicknesses of the second film layer and the hole blocking layer are both in a range of 2 nm to 10 nm.

14. The organic light-emitting diode device according to claim 13, wherein the thickness of the hole blocking layer is less than the thickness of the second film layer.

15. The organic light-emitting diode device according to claim 8, wherein a thickness of the electron transport layer is in a range of 15 nm to 50 nm.

16. The organic light-emitting diode device according to claim 9, wherein the hole blocking layer further comprises a lithium compound, a zinc powder, and a phosphorescent material.

17. The organic light-emitting diode device according to claim 1, further comprising an electron blocking layer, a hole transport layer, and a hole injection layer which are stacked on a side of the light emitting layer away from the electron transport layer;
wherein the electron blocking layer is adjacent to the light emitting layer, and the hole transport layer is located between the electron blocking layer and the hole injection layer.

18. A display apparatus, comprising an organic light-emitting diode device, the organic light-emitting diode device comprising:
an electron transport layer, a hole blocking layer and a light emitting layer arranged in a stacked manner;
wherein the hole blocking layer comprises a first material configured to block a hole in the light emitting layer, and the electron transport layer comprises the first material;
wherein the electron transport layer comprises a first film layer and a second film layer stacked on the first film layer, the second film layer is adjacent to the hole blocking layer, and the second film layer comprises the first material;
wherein the first film layer excludes the first material.

19. An organic light-emitting diode device, comprising:
an electron transport layer, a hole blocking layer and a light emitting layer arranged in a stacked manner;
wherein the hole blocking layer comprises a first material configured to block a hole in the light emitting layer, and the electron transport layer comprises the first material;
wherein the electron transport layer comprises a first film layer and a second film layer stacked on the first film layer, the second film layer is adjacent to the hole blocking layer, and the second film layer comprises the first material;
wherein a lowest unoccupied molecular orbital energy level of the first material in the second film layer is less than a lowest unoccupied molecular orbital energy level of the first material in the hole blocking layer.

20. The organic light-emitting diode device according to claim 19, wherein the lowest unoccupied molecular orbital energy level of the first material in the hole blocking layer is less than −2.6 ev, and the lowest unoccupied molecular orbital energy level of the first material in the second film layer is greater than −2.6 ev.

* * * * *